(12) United States Patent
Singh et al.

(10) Patent No.: US 11,387,353 B2
(45) Date of Patent: Jul. 12, 2022

(54) STRUCTURE PROVIDING CHARGE CONTROLLED ELECTRONIC FUSE

(71) Applicant: GLOBALFOUNDRIES U.S. Inc., Santa Clara, CA (US)

(72) Inventors: Jagar Singh, Clifton Park, NY (US); Sudarshan Narayanan, Framingham, MA (US); Alvin J. Joseph, Williston, VT (US); William J. Taylor, Jr., Clifton Park, NY (US); Jeffrey B. Johnson, Essex Junction, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/907,600

(22) Filed: Jun. 22, 2020

(65) Prior Publication Data

US 2021/0399116 A1 Dec. 23, 2021

(51) Int. Cl.
*H01L 29/68* (2006.01)
*H01L 29/08* (2006.01)
(Continued)

(52) U.S. Cl.
CPC ........ *H01L 29/685* (2013.01); *H01L 29/0649* (2013.01); *H01L 29/0843* (2013.01); *H01L 29/1025* (2013.01); *H01L 27/11206* (2013.01)

(58) Field of Classification Search
CPC ........... H01L 29/66613; H01L 29/7824; H01L 29/66681–66704; H01L 29/7816–7826; H01L 29/7823; H01L 29/0869; H01L 29/402; H01L 29/0696; H01L 29/404; H01L 29/0882; H01L 29/0865; H01L 29/7831; H01L 29/0886; H01L 23/535; H01L 29/063; H01L 29/1095; H01L 29/0878; H01L 29/66545; H01L 21/76846;
(Continued)

(56) References Cited

U.S. PATENT DOCUMENTS 7,960,809 B2 6/2011 Kothandaraman et al.
2008/0169529 A1 7/2008 Kim et al.
(Continued)

OTHER PUBLICATIONS

Tonti, "eFuse Design and Reliability," 2008 IEEE International Integrated Reliability Workshop Final Report, S. Lake Tahoe, CA, 2008, pp. 1-32.
(Continued)

*Primary Examiner* — Moin M Rahman
(74) *Attorney, Agent, or Firm* — Francois Pagette; Hoffman Warnick LLC

(57) ABSTRACT

A structure includes a first source/drain region and a second source/drain region in a semiconductor body; and a trench isolation between the first and second source/drain regions in the semiconductor body. A first doping region is about the first source/drain region, a second doping region about the second source/drain region, and the trench isolation is within the second doping region. A third doping region is adjacent to the first doping region and extend partially into the second doping region to create a charge trap section. A gate conductor of a gate structure is over the trench isolation and the first, second, and third doping regions. The charge trap section creates a charge controlled e-fuse operable by applying a stress voltage to the gate conductor.

16 Claims, 2 Drawing Sheets

(51) Int. Cl.
    *H01L 29/06*     (2006.01)
    *H01L 29/10*     (2006.01)
    *H01L 27/112*     (2006.01)

(58) Field of Classification Search
CPC .......... H01L 21/76849; H01L 29/7845; H01L 21/76834; H01L 29/41791; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823821; H01L 21/823842; H01L 21/823857; H01L 21/823871; H01L 21/823878; H01L 23/5283; H01L 23/53266; H01L 27/0924; H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 23/528; H01L 27/0922; H01L 29/167; H01L 29/66636; H01L 29/7851; H01L 29/66795; H01L 29/7846; H01L 29/785; H01L 29/165; H01L 21/76897; H01L 23/5226; H01L 23/53209; H01L 23/53238; H01L 21/76816; H01L 29/0649; H01L 29/66818; H01L 29/7848; H01L 29/7843; H01L 27/0886; H01L 21/76232; H01L 29/6656; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/485; H01L 21/845; H01L 29/1054; H01L 29/66803; H01L 29/51; H01L 29/10; H01L 29/78; H01L 21/28; H01L 21/28194; H01L 29/513; H01L 29/517

See application file for complete search history.

(56) References Cited

U.S. PATENT DOCUMENTS

| | | | |
|---|---|---|---|
| 2016/0181358 A1* | 6/2016 | Zhang | H01L 29/6681 257/339 |
| 2018/0006149 A1* | 1/2018 | Kim | H01L 29/0649 |
| 2019/0305129 A1* | 10/2019 | Uda | H01L 29/7825 |
| 2020/0006549 A1* | 1/2020 | Sadovnikov | H01L 29/0847 |

OTHER PUBLICATIONS

Rizzolo et al., "IBM System z9 eFUSE applications and methodology." IBM Journal of Research and Development. vol. 51. 2007. pp. 65-75.

* cited by examiner

STRUCTURE PROVIDING CHARGE CONTROLLED ELECTRONIC FUSE

BACKGROUND

The present disclosure relates to semiconductor devices, and more specifically, to a structure providing a charge controlled electronic fuse.

Advanced manufacturing of integrated circuits (ICs) requires formation of individual circuit elements, e.g., resistors, transistors such as field-effect-transistors (FETs) and the like, based on specific circuit designs. Electrical fuses are used in ICs for a number of reasons such as protecting sensitive structure, and/or activating or deactivating different structure. Currently, electrical fuses, referred to as e-fuses for short, are formed in the back-end-of-line (BEOL) or middle-of-line (MOL) layers by forming a thin metal film or via-metal structure. BEOL layers are formed on a semiconductor wafer in the course of device manufacturing following first metallization, i.e., a transistor or device layer, and MOL are between the BEOL and first metallization. One disadvantage of metal or via-based e-fuses is they require a large current to open (blow) the fuse. The use of large current can lead to electro-migration reliability concerns in the BEOL or MOL layers.

SUMMARY

Aspects of the disclosure are directed to a structure comprising: a first source/drain region and a second source/drain region in a semiconductor body; a trench isolation between the first and second source/drain regions in the semiconductor body; a first doping region about the first source/drain region; a second doping region about the second source/drain region, the trench isolation being within the second doping region; a third doping region adjacent to the first doping region and extending partially into the second doping region; and a gate conductor of a gate structure over the trench isolation and the first, second, and third doping regions.

Further aspects of the disclosure include an electronic fuse, comprising: a first source/drain region and a second source/drain region in a semiconductor fin; a trench isolation between the first and second source/drain regions in the semiconductor fin; a p-well about the first source/drain region; an n-well about the second source/drain region, creating a source/drain extension adjacent the trench isolation within the n-well; an n-type doped charge trap section adjacent to the p-well and extending partially into the source/drain extension; and a gate conductor of a gate structure over the trench isolation and the p-well, the n-well, and the n-type doped charge trap section, wherein a dopant concentration of the n-type doped charge trap section is at least twice that of the n-well.

Yet another aspect of the disclosure relates to a laterally-diffused metal-oxide semiconductor (LDMOS) device, comprising: a first source/drain region and a second source/drain region in a semiconductor fin; a trench isolation between the first and second source/drain regions in the semiconductor fin; a p-well about the first source/drain region; an n-well about the second source/drain region, creating a source/drain extension adjacent the trench isolation within the n-well; an n-type doped charge trap section adjacent to the p-well and extending partially into the source/drain extension; and a gate conductor of a gate structure over the trench isolation and the p-well, the n-well, and the n-type doped charge trap section, wherein the n-well is between the trench isolation and the n-type doped charge trap section.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
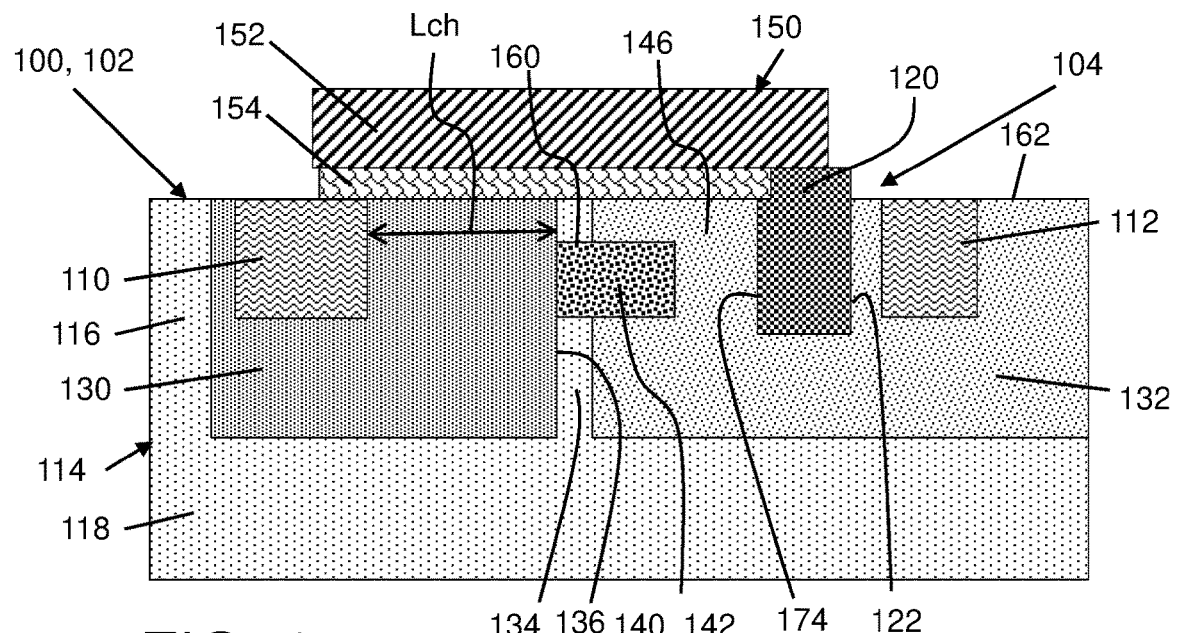
FIG. 1 is a cross-sectional view of a structure providing a charge controlled e-fuse, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure providing a charge controlled electronic fuse (e-fuse) in, for example, a laterally-diffused metal-oxide semiconductor (LDMOS) device. The structure incorporates a doped charge trap section in a drain extension adjacent a trench isolation. A stress voltage applied to the gate increases the charge trapping in a gate dielectric layer due to hot carrier injection (HCI) events in the drain extension region, which blocks carrier current flow in the drain extension, thus creating an e-fuse. The resistance created can be customized based on, for example, the dopant concentration of the doped charge trap section. The disclosure is especially advantageous relative to semiconductor fins because the gate wrapping around the fin allows charge collection to be a multiple of what would occur in a planar device.

Figure 2:
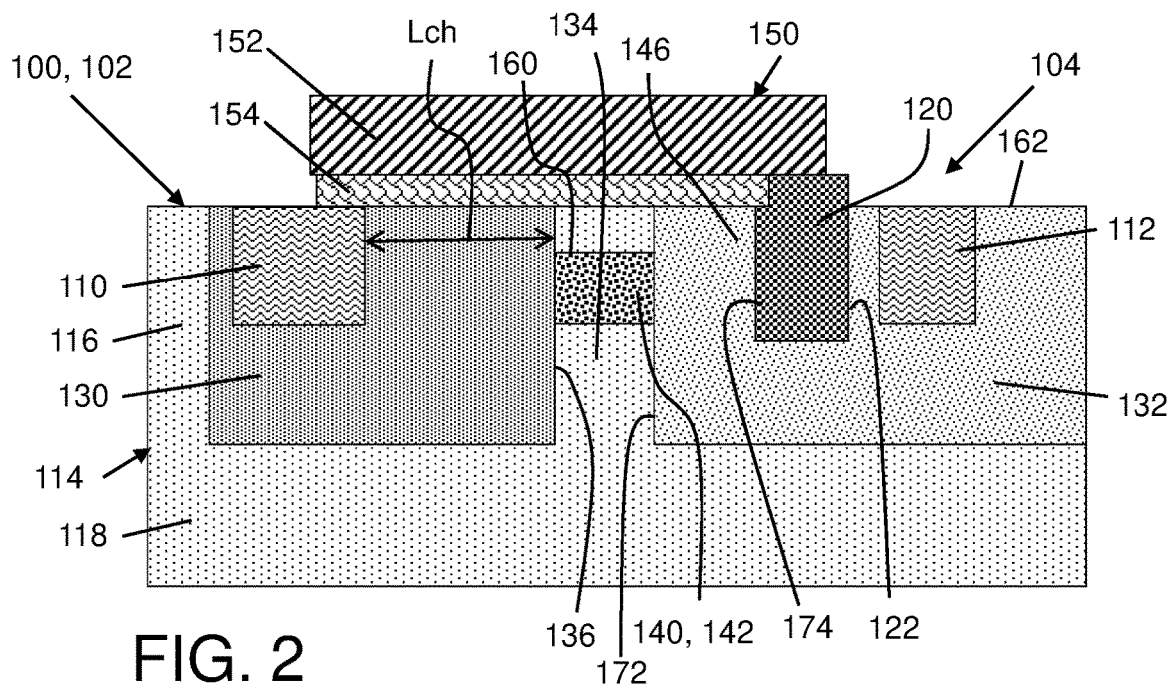
FIG. 2 is a cross-sectional view of a structure providing a charge controlled e-fuse, according to other embodiments of the disclosure.
Figure 3:
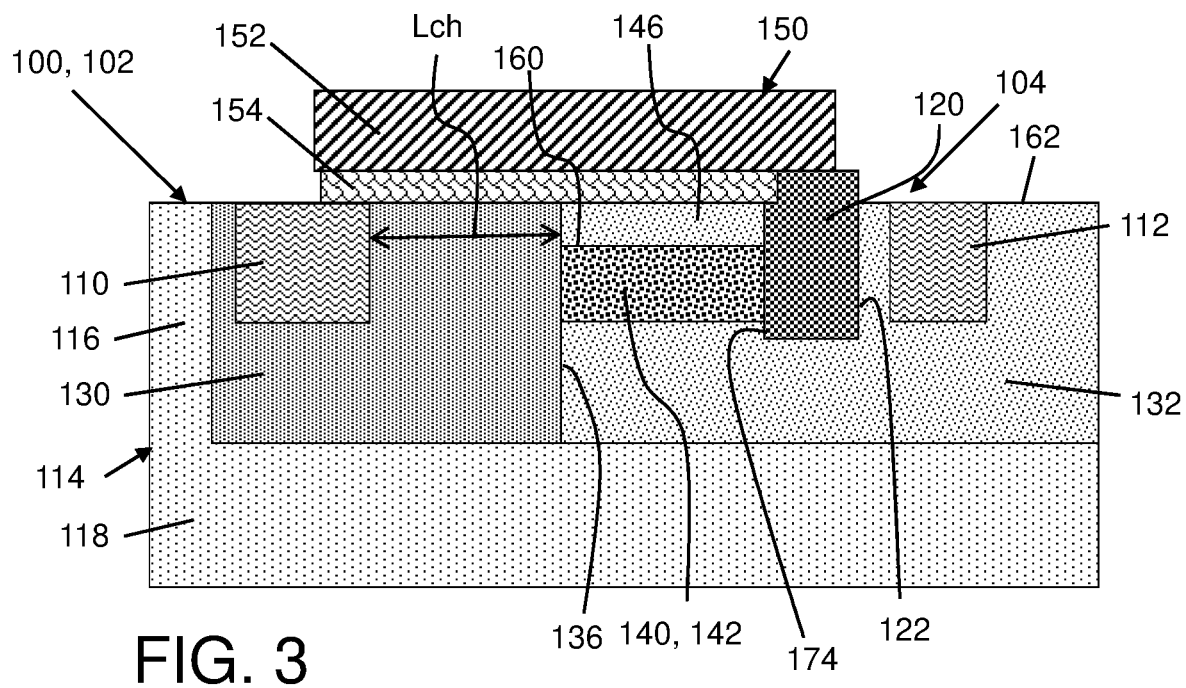
FIG. 3 is a cross-sectional view of a structure providing a charge controlled e-fuse, according to yet other embodiments of the disclosure.

FIGS. 1-3 are cross-sectional views of a structure 100 according to various embodiments of the disclosure. Structure 100 provides a charge controlled electronic fuse 102 (hereafter "e-fuse 102"). For purposes of description, structure 100 may be implemented in the form of a LDMOS device 104, but it is emphasized that it can also be applied in other types of MOS devices.

Structure 100 includes a first source/drain region 110 and a second source/drain region 112 in a semiconductor body 114. Semiconductor body 114 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. Semiconductor body 114 may take the form of a semiconductor fin 116 over a (bulk) semiconductor substrate 118.

Semiconductor substrate 118 may include a dopant. In one embodiment, the dopant may include a p-type dopant, which may include but is not limited to: boron (B), indium (In) and gallium (Ga). P-type dopants are elements introduced to semiconductor to generate free hole by "accepting" electron from semiconductor atom and "releasing" hole at the same time. The dopant may be introduced to semiconductor substrate 118 in any now known or later developed fashion, e.g., in-situ doping during formation, or ion implanting. Usually in doping, a dopant, a dosage and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/$cm^2$, and an energy of about 40 to 80 keV to produce a dopant concentration of between 1E17 and 1E18 atoms/$cm^3$.

Source/drain regions 110, 112 may be formed using any now known or later developed semiconductor fabrication technique. For example, source/drain regions 110, 112 may be formed by mask-directed doping by ion implantation followed by an anneal to drive in the dopants. Source/drain regions 110, 112 may be doped with an n-type dopant. N-type dopants may include but are not limited to: phosphorous (P), arsenic (As), or antimony (Sb). N-type is an element introduced to semiconductor to generate free electrons by "donating" electrons to the semiconductor.

Structure 100 may also include a trench isolation 120 between first and second source/drain regions 110, 112 in semiconductor body 114. Trench isolation 120 may take any form of trench isolation, but typically includes a shallow trench isolation (STI). Trench isolation 120 may be formed using any now known or later developed semiconductor fabrication technique. Generally, a trench 122 is etched into semiconductor body 114, i.e., semiconductor fin 116, and filled with an insulating material such as oxide, to isolate one region of semiconductor body 114 from an adjacent region of the body. Trench isolation 120 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Structure 100 also includes a first doping region 130 about first source/drain region 110. First doping region 130 may take the form of a p-type doped well, or p-well (hereafter "p-well 130"). The p-type dopant may be the same as semiconductor body 114, but with a higher dopant concentration. P-well 130 may be formed using any now known or later developed semiconductor fabrication technique, e.g., mask-directed ion implantation prior to formation of first source/drain region 110. Structure 100 also includes a second doping region 132 about second source/drain region 112. Trench isolation 120 is within second doping region 132. Second doping region 132 may be between second source/drain region 112 and trench isolation 120, although this is not necessary in all cases. Second doping region 132 may take the form of an n-type doped well, or n-well (hereafter "n-well 132"). The n-type dopant may be the same as source/drain regions 110, 112, but with a lower dopant concentration. N-well 132 may be formed using any now known or later developed semiconductor fabrication technique, e.g., mask-directed ion implantation prior to formation of second source/drain region 112. In the FIG. 3 embodiment, p-well 130 and n-well 132 generally meet along facing edges thereof. In contrast, as shown in the FIGS. 1-2 embodiments, structure 100 has p-well 130 and n-well 132 separated by a portion 134 having the same doping as semiconductor body 114. As understood in the field, a space between first source/drain region 110 and an edge 136 of p-well 130 defines a channel length (Lch) of the device.

In accordance with embodiments of the disclosure, structure 100 includes a third doping region 140 adjacent to p-well 130 and extending partially into n-well 132. As will be described, third doping region 140 forms a charge trap section 142. Charge trap section 142 (third doping region 140) may have a dopant that is of a same type as a dopant of n-well (second doping region) 132. A gate conductor 152 of a gate structure 150 is over trench isolation 120 and p-well 130, n-well 132, and charge trap section 142. Gate structure 150 may include a metal gate. The metal gate may include a gate dielectric layer 154, and a gate conductor 152. Gate dielectric layer 154 may include any now known or later developed high-K material typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Gate conductor 152 may include any now known or later developed gate conductors. For example, gate conductor 152 may include a work function metal layer and gate conductor layer (not separately shown). The work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor layer may include any now known or later developed gate conductor such as copper (Cu).

N-well 132 may extend between an upper edge 160 of charge trap section 142 and an upper surface 162 of semiconductor body 114, i.e., of semiconductor fin 116. A dopant of charge trap section 142 (third doping region) may include the same dopant as n-well 132 (second doping region), and dopant of n-type charge trap section 142 is of an opposite type than a dopant of p-well 130 (first doping region). A dopant concentration of charge trap section 142 may be selected to customize charge trapping in gate dielectric layer 154. In this manner, the stress voltage applied to gate structure 150 that will cause operational degradation that creates sufficient charge trapping to cease current flow in the structure can be customized, thus creating a customized e-fuse 102. In certain embodiments, dopant of charge trap section 142 (third doping region) has a dopant concentration at least twice that of the dopant of n-well 132 (second doping region).

Charge trap section 142 can have a variety of shapes and/or locations. Charge trap section 142 extends from edge 136 of p-well 130 towards trench isolation 120, and a source/drain extension 146 may extend in n-well 132. As illustrated in FIGS. 1 and 2, in contrast to conventional LDMOS devices, in certain embodiments, charge trap section 142 may be spaced from a side 170 of trench isolation 120. Here, n-well 132 is also between trench isolation 120 and charge trap section 142. Due to the presence of charge trap section 142, source/drain extension 146 may be significantly smaller than in conventional LDMOS devices, e.g., at least one third of the conventional dimension. In certain embodiments, as shown in FIGS. 1 and 3, charge trap section 142 extends into n-well 132, i.e., an edge of charge trap section 142 extends into n-well 132. That is, charge trap section 142 extends from p-well 130 and past an edge 172 of n-well 132. In contrast, in certain embodiments shown in FIG. 2, charge trap section 142 may extend from p-well 130 (e.g., edge 136 thereof) to an edge 172 of n-well 132. Referring to FIG. 3, in certain embodiments, charge trap section 142 may extend from p-well 130 through n-well 130 to trench isolation 120, i.e., to side 174 of trench isolation 120. Various other shapes and/or locations may be possible.

Figure 4:
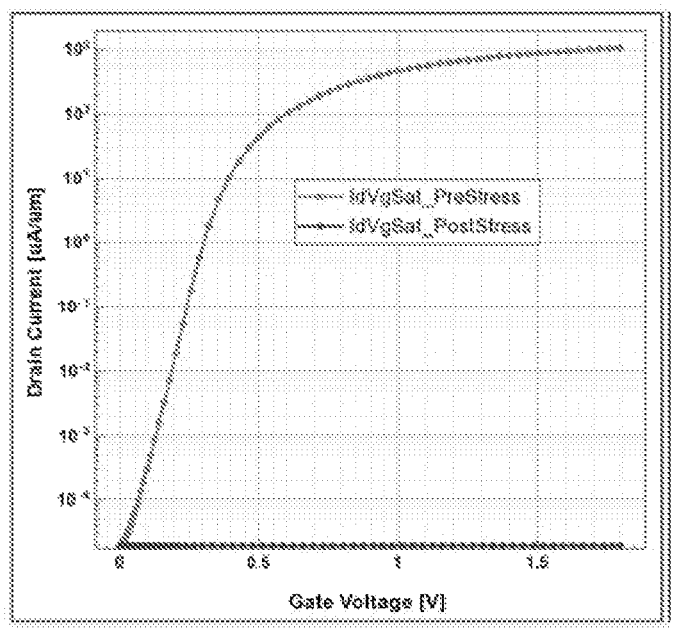
FIG. 4 shows a graphical representation of operational modes of the structure, according to embodiments of the disclosure.

In operation, as shown in the graph of FIG. 4, LDMOS device 104 may operate in accordance with any other LDMOS device 104—see "pre-stress" curve. However, upon application of stress voltage (Vgsat) to gate conductor 152 of gate structure 150, charge quickly builds up in gate dielectric layer 154, and perhaps to a smaller degree on a side of trench isolation 120, e.g., at semiconductor-oxide interface. The charge trapping saturates source/drain extension 146, thus increasing the resistance and ceasing current flow. That is, drain current (IdVgsat) goes to zero—see "post-stress" curve along bottom of graph. Thus, charge trap section 142, using stress hard carrier induced (HCl) MOSFET degradation, transforms LDMOS device 104 to a charge controlled (or one time programmable) e-fuse 102. The operational pre- and post-stress resistance value of structure 100 can be based on the bias conditions and the charge trap density. As noted, the disclosure is especially advantageous relative to semiconductor fins 116 because gate structure 150 wrapping around the fin allows charge trapping to be a multiple of what would occur in a planar device.

While embodiments of the disclosure have been disclosed with a particular arrangement of dopant types that create the various doping regions, i.e., for an NFET, it is apparent that the various structures may have the opposite doping types for an opposite type device, i.e., for PFET. That is, semiconductor body 114 may be doped with an n-type dopant, first doping region 130 may be an n-well, second doping region 132 may be a p-well, and third doping region 140/charge trap section 142 may be doped with a p-type dopant.

An IC that includes structure 100, e-fuse 102, or LDMOS 104, can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An electronic fuse, comprising:
   a first source/drain region and a second source/drain region in a semiconductor body;
   a trench isolation between the first and second source/drain regions in the semiconductor body;
   a p-well about the first source/drain region;
   an n-well about the second source/drain region, creating a source/drain extension adjacent the trench isolation within the n-well;
   an n-type doped charge trap section adjacent to the p-well and extending partially into the source/drain extension; and
   a gate conductor of a gate structure over the trench isolation and the p-well, the n-well, and the n-type doped charge trap section,
   wherein a dopant concentration of the n-type doped charge trap section is at least twice that of the n-well,
   wherein the semiconductor body includes a fin over a bulk substrate.

2. The electronic fuse of claim 1, wherein the n-type doped charge trap section extends from the p-well to an edge of the n-well.

3. The electronic fuse of claim 1, wherein the n-well is between the trench isolation and the n-type doped charge trap section.

4. The electronic fuse of claim 1, wherein the n-type doped charge trap section extends from the p-well through the n-well to the trench isolation.

5. The electronic fuse of claim 1, wherein the n-well is between the second source/drain region and the trench isolation.

6. The electronic fuse of claim 1, wherein the n-well extends between an upper edge of the n-type doped charge trap section and an upper surface of the semiconductor body.

7. A laterally-diffused metal-oxide semiconductor (LDMOS) device, comprising:
   a first source/drain region and a second source/drain region in a semiconductor body;
   a trench isolation between the first and second source/drain regions in the semiconductor body;
   a p-well about the first source/drain region;
   an n-well about the second source/drain region, creating a source/drain extension adjacent the trench isolation within the n-well;
   an n-type doped charge trap section adjacent to the p-well and extending partially into the source/drain extension; and
   a gate conductor of a gate structure over the trench isolation and the p-well, the n-well, and the n-type doped charge trap section,
   wherein a portion of the n-well is between the trench isolation and the n-type doped charge trap section, and
   wherein the semiconductor body includes a fin over a bulk substrate.

8. The LDMOS device of claim 7, wherein the n-well is between the second source/drain region and the trench isolation.

9. The LDMOS device of claim 7, wherein a dopant concentration of the n-type doped charge trap section is at least twice that of the n-well.

10. An electronic fuse, comprising:
    a first source/drain region and a second source/drain region in a semiconductor body;
    a trench isolation between the first and second source/drain regions in the semiconductor body;
    an n-well about the first source/drain region;
    a p-well about the second source/drain region, creating a source/drain extension adjacent the trench isolation within the p-well;
    a p-type doped charge trap section adjacent to the n-well and extending partially into the source/drain extension; and
    a gate conductor of a gate structure over the trench isolation and the n-well, the p-well, and the p-type doped charge trap section,
    wherein a dopant concentration of the p-type doped charge trap section is at least twice that of the p-well.

11. The electronic fuse of claim 10, wherein the p-type doped charge trap section extends from the n-well to an edge of the p-well.

12. The electronic fuse of claim 10, wherein the p-well is between the trench isolation and the p-type doped charge trap section.

13. The electronic fuse of claim 10, wherein the p-type doped charge trap section extends from the n-well through the p-well to the trench isolation.

14. The electronic fuse of claim 10, wherein the p-well is between the second source/drain region and the trench isolation.

15. The electronic fuse of claim 10, wherein the p-well extends between an upper edge of the p-type doped charge trap section and an upper surface of the body.

16. The electronic fuse of claim 10, wherein the semiconductor body includes a fin over a bulk substrate.

* * * * *